United States Patent [19]

Chen

[11] Patent Number: 5,694,843
[45] Date of Patent: Dec. 9, 1997

[54] PC(PRINTED CIRCUIT) BOARD PRINTING MACHINE WITH CANTILEVER-SUPPORTED PRINTING HEAD AND STENCIL HOLDERS AND BI-DIRECTIONALLY MOVABLE PRINTING TABLE

[76] Inventor: Tung-Chin Chen, No. 65, Wuchuen 7th Road, Wuku Industrial Area, Taipei Hsien, Taiwan

[21] Appl. No.: 662,355

[22] Filed: Jun. 12, 1996

[51] Int. Cl.⁶ ................................................ B05C 17/04
[52] U.S. Cl. ............................................. 101/123; 101/126
[58] Field of Search ............................... 101/123, 124, 101/126, 129, 127.1

[56] References Cited

U.S. PATENT DOCUMENTS

| | | | |
|---|---|---|---|
| 4,079,671 | 3/1978 | Dubuit | 101/124 |
| 4,111,118 | 9/1978 | Green et al. | 101/123 |
| 4,248,150 | 2/1981 | Lalor | 101/123 |
| 4,817,523 | 4/1989 | Harpold et al. | 101/123 |

*Primary Examiner*—Ren Yan
*Attorney, Agent, or Firm*—Bacon & Thomas

[57] ABSTRACT

Disclosed is a PC board printing machine with cantilever-supported printing head and stencil holders and bi-directionalty movable printing table, and more particularly to a PC board printing machine which includes a cantilever mechanism, a motor dual-rail transmission mechanism, a exchangeable printing head and stencil cleaning lift-up mechanism, a simple stencil frame holder and dual-oil-cylinder stencil lifting mechanism, and an automatically bi-directionally movable printing table mechanism to produce high printing quality.

6 Claims, 15 Drawing Sheets

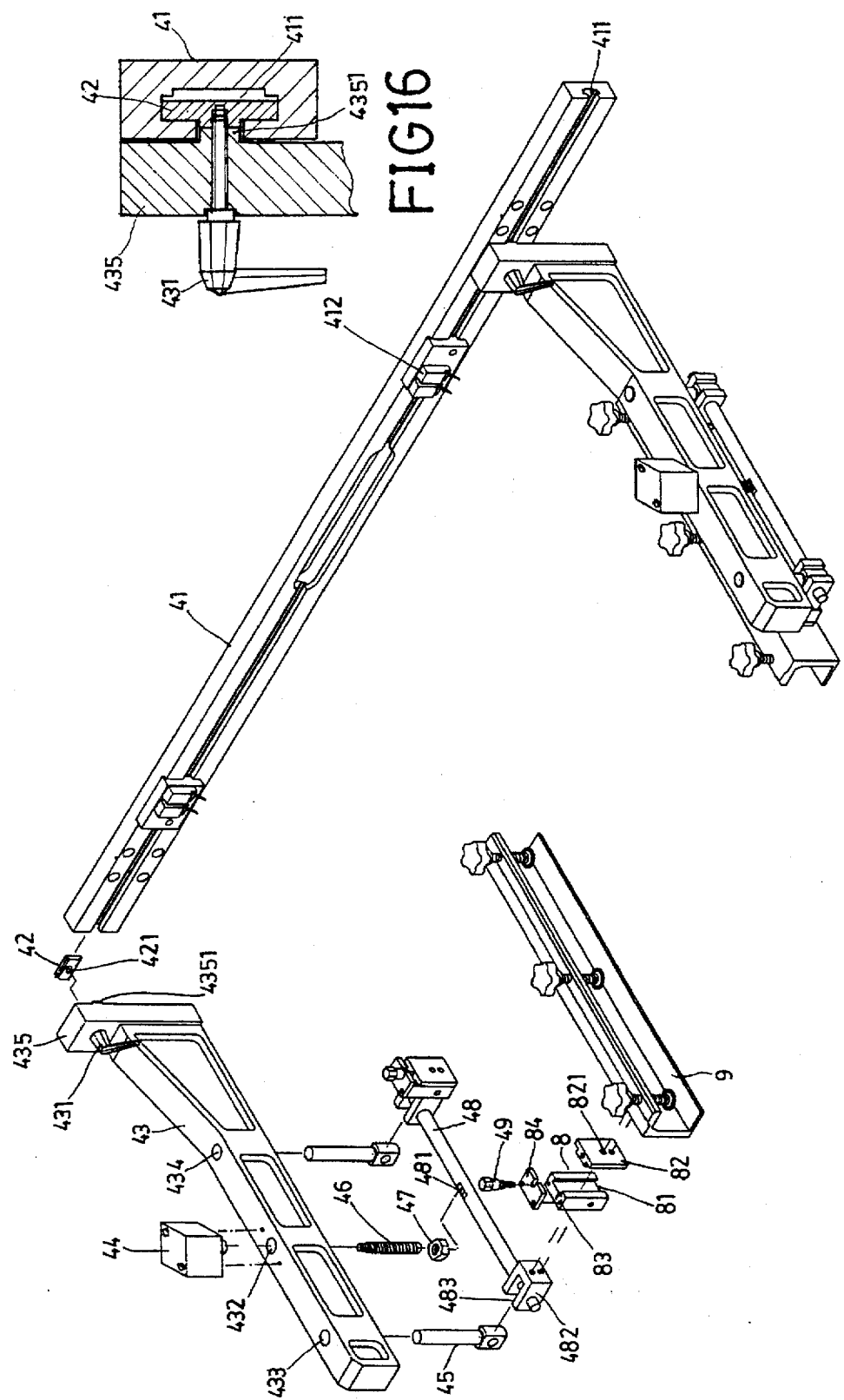

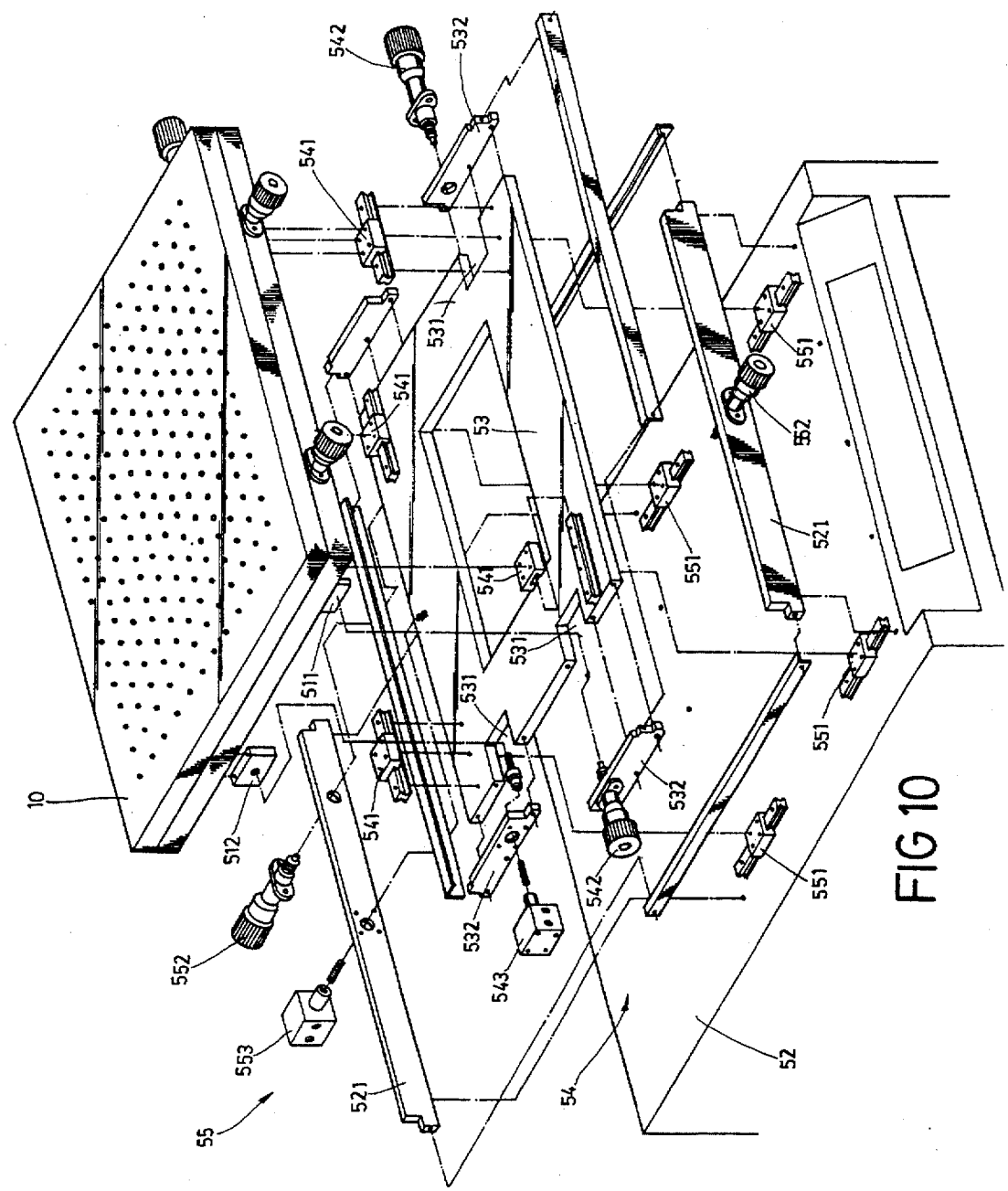

5,694,843

PC(PRINTED CIRCUIT) BOARD PRINTING MACHINE WITH CANTILEVER-SUPPORTED PRINTING HEAD AND STENCIL HOLDERS AND BI-DIRECTIONALLY MOVABLE PRINTING TABLE

BACKGROUND OF THE INVENTION

Most of the presently commercially available PC board printing machines are bulky in volume and complicated in structure, and therefore, expensive in price. Another common disadvantage existed in the conventional PC board printing machines is the circuit board must be heat dried when one side thereof has been printed and can be printed on the other side only when it is cooled to the room temperature. And, the double side printed circuit board must heat dried again. It is therefore desirable to develop a PC board printing machine which has small volume without occupying too much room and simple structure which allows high precision printing effect to reduce the bad yield of prints, and, two of such PC board printing machines working with supporting pin system used at the same time shall permit the circuit board to be printed in one operation to save one heat drying process.

SUMMARY OF THE INVENTION

A primary object of the present invention is to provide a PC board printing machine which is small in volume and simple in structure while provides high precision printing effect. In the PC board printing machine according to the present invention, the printing stencil is moved in vertical direction and therefore ink thereon will not flow to one side.

Another object of the present invention is to provide a PC board printing machine which uses air cylinders to achieve two-side stencil lifting so that the printing stencil can be lightly lifted to separate from the circuit board being printed while a sideward reciprocating printing is proceeding, and therefore re-producing a fine and even effect.

A further object of the present invention is to provide a PC board printing machine in which the printing head and the stencil frame holders are of cantilever type and can be moved vertically through a hand wheel to permit quick and direct replacement of the printing stencil, as well as adjustable height of printing stencil to meet different thickness of circuit board to be printed.

A still further object of the present invention is to provide a PC board printing machine in which precision DC motors are employed to drive and control the movement and transverse travel of the cantilever-type printing head on a guiding rail. Moreover, the guiding rail is made of highly rigid steel which is strong enough to bear the load from the cantilever and permit stable printing.

A still further object of the present invention is to provide a PC board printing machine in which the printing head is adjustable to allow the ink scrapers held thereto to have angles most suitable for printing in every different conditions without the risk of omitting printing at any corner difficult to reach.

A still further object of the present invention is to provide a PC board printing machine which has an automatically bi-directionally movable printing table mechanism which is particularly designed for printing liquid green paint on circuit boards biaxially. The mechanism includes a pivotal connecting board and several sets of sideward and longitudinal translation means connected to the pivotal connecting board disposed between the printing table and the top platform of the printing machine, so that the printing can be performed in biaxial and reciprocating movements.

The above objects can be achieved from the PC board printing machine with cantilever-supported printing head and stencil holders and bi-directionally movable printing table provided according to the present invention. Briefly, the present invention includes a cantilever mechanism, a motor Dual-rail transmission mechanism, a exchangeable printing head and stencil cleaning Lift-up mechanism, a simple stencil frame holder and dual-oil-cylinder stencil lifting mechanism, and an automatically bi-directionally movable printing table mechanism. Wherein, the motor dual-rail transmission mechanism have two linear guide rails which cooperate with one transmission motor to enable smooth and stable movement of a printing head holder. Meanwhile, an air cylinder is employed to drive a cantilever connecting the printing head holder so that the printing heads attached to the printing head holder can be vertically lowered or raised within a large area. A threaded stem with hand wheel is used to adjust the height of the printing stencil so that printing can be performed on circuit boards having different thickness. The exchangeable printing head and stencil cleaning lift-up mechanism includes ink scraper holders which allow the ink scrapers to properly contact the stencil screen to perform the most perfect ink spreading. The simple stencil frame holder and dual-oil-cylinder stencil lifting mechanism provides oil pressure controlled off-contact function that permits adjustable off-contact speed and height and thereby avoids any screen-sticking after printing to enhance the quality of the PC board.

BRIEF DESCRIPTION OF THE DRAWINGS

FIG. 9 is a disassembled perspective showing the simple stencil frame holder and dual-oil-cylinder stencil lifting mechanism of the present invention;

FIG. 10 is a disassembled perspective showing the automatically bi-directionally movable printing table mechanism of the present invention;

FIG. 16 is a fragmentary sectional view showing the connection of the sliding block to the sliding key and the guide rail of the simple stencil frame holder mechanism of the present invention.

DETAILED DESCRIPTION OF THE PREFERRED EMBODIMENT

Figure 1:
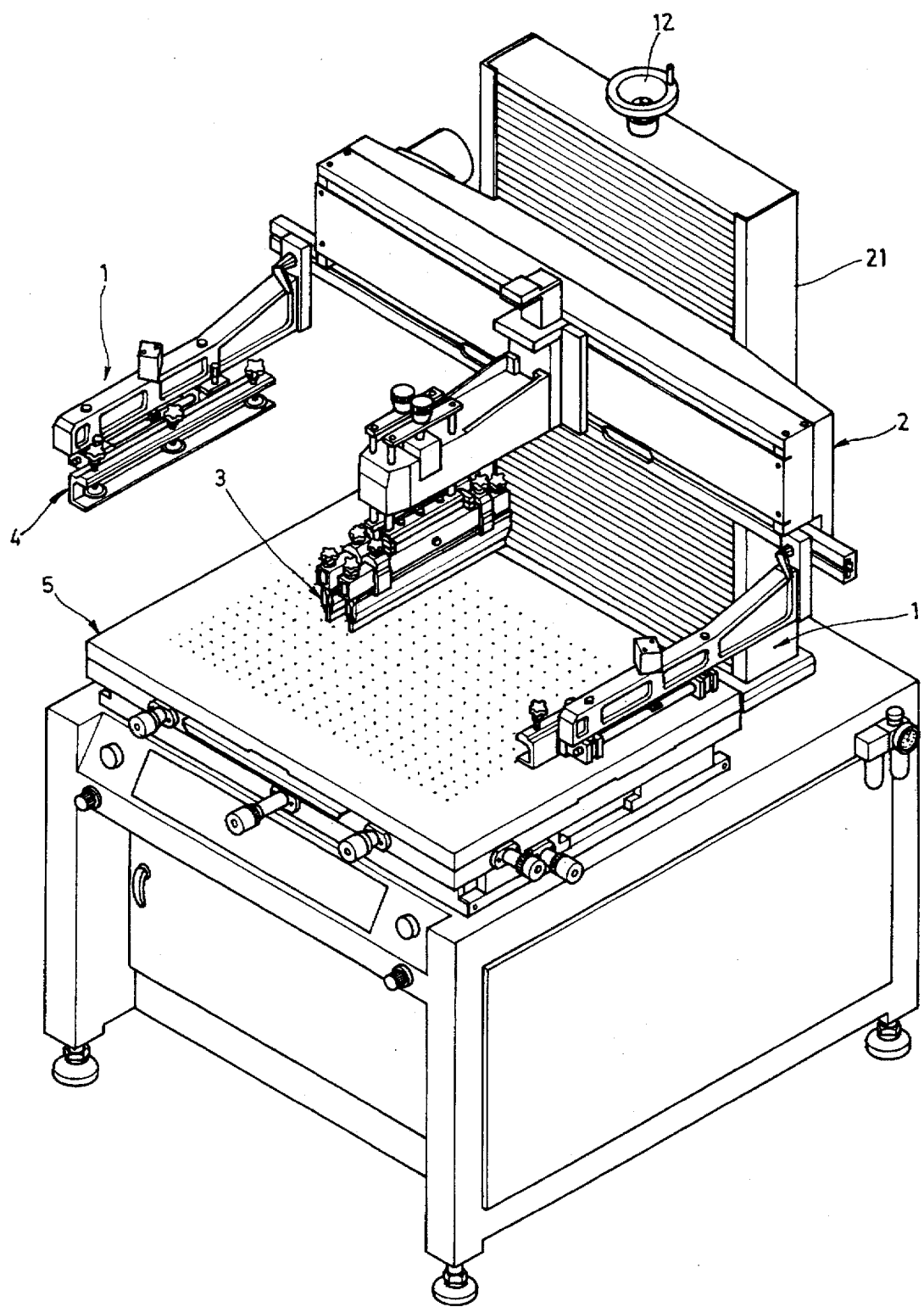
FIG. 1 is a three-dimensional perspective showing a complete set of PC board printing machine according to the present invention.

Please refer to FIG. 1 which is a three-dimensional perspective of a complete set of a PC board printing machine according to the present invention. From FIG. 1, it can be seen that the present invention mainly includes a cantilever mechanism 1, a motor dual-rail transmission mechanism 2, an exchangeable printing head and stencil cleaning lift-up mechanism 3, a simple stencil frame holder and dual-oil-cylinder stencil lifting mechanism 4, and an automatically bi-directionally movable printing table mechanism 5.

Figure 2:
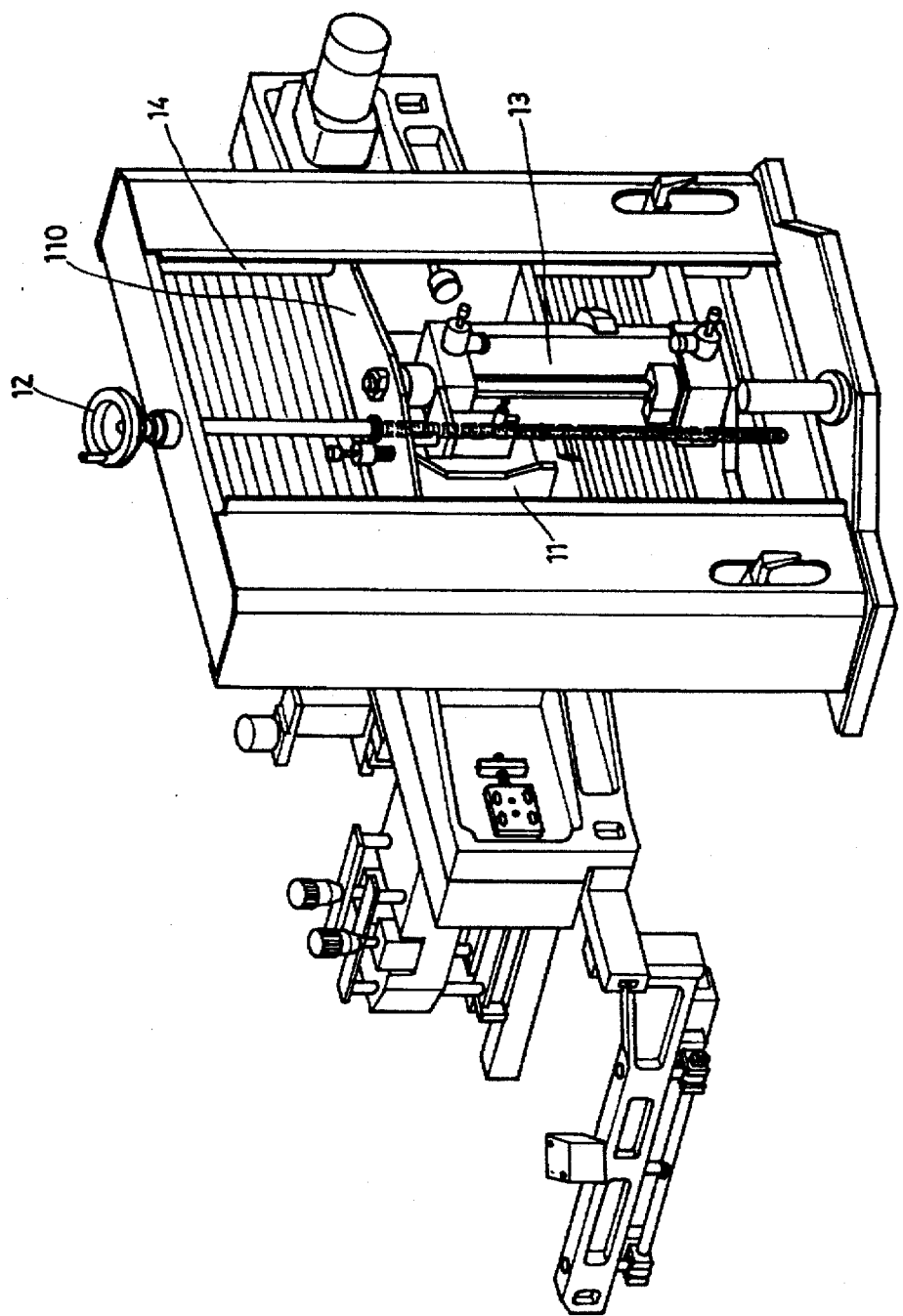
FIG. 2 is a rear perspective view showing the cantilever mechanism of the present invention.

Please now refer to FIG. 2. The cantilever mechanism 1 includes a cantilever member 11, a threaded stem with a hand wheel 12, an air cylinder 13, and two fixing shafts 14. The cantilever member 11 has two end portions being separately extended through by the two fixing shafts 14 so that the cantilever member 11 may move up and down along the fixing shafts 14. The threaded stem with hand wheel 12 extends through a top center of the cantilever member 11 and is fixedly attached thereto for directly adjusting the height of a whole printing stencil. The air cylinder 13 is connected to a lower side of the cantilever member 11 for driving the cantilever member 11 to move up or down along the fixing shafts 14.

Figure 3:
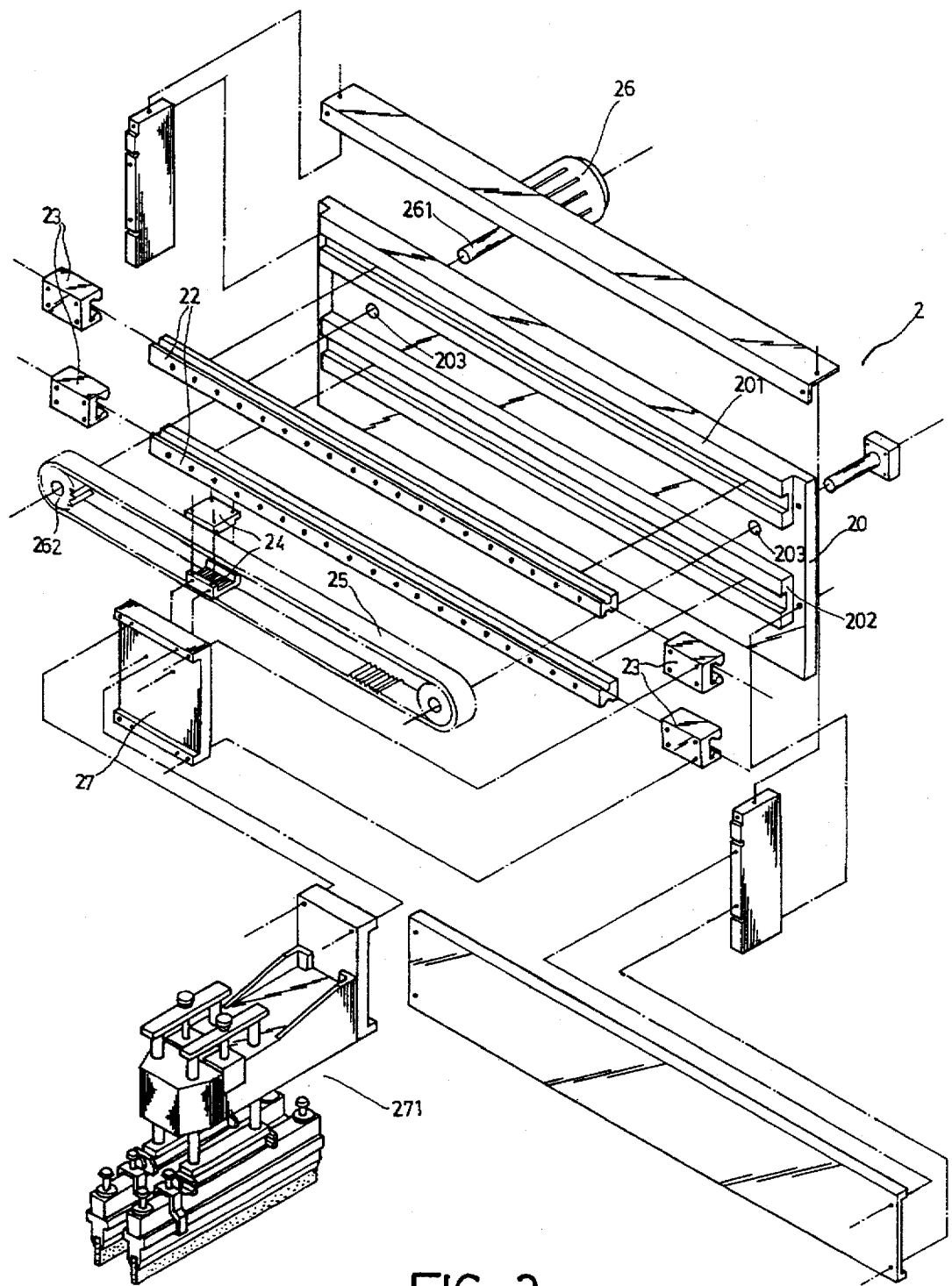
FIG. 3 is a disassembled perspective showing the motor dual-rail transmission mechanism of the present invention.

FIG. 3 illustrates the motor dual-rail transmission mechanism 2. The mechanism 2 includes a back board 20 fixedly mounted onto a protective housing 21 (see FIG. 1), two linear guide rails 22, a plurality of guide rail blocks 23, two locating clamp mates 24, a transmission belt 25, one motor 26, and a printing head connecting bracket 27. The back board 20 is provided at a front surface with two guide rail supporters 201, 202 for the two linear guide rails 22 to attach thereto. The guide rail blocks 23 are mounted on the guide rails 22 and the printing head connecting bracket 27 is fixedly secured to the guide rail blocks 23. The motor 26 is separately disposed near one end of the back board 20 with their respective rotary shafts 261 extending through holes 203 formed on the back board 20. Gears 262 are mounted on the rotary shafts 261 for the transmission belt 25 to mount thereon. The locating clamp mates 24 are fixedly fastened on the transmission belt 25 and the printing head connecting bracket 27 and one of the guide rail blocks 23 are fixedly secured to a lower and an upper part of the locating clamp mates 24, respectively. A printing head holder 271 is connected to the printing head connecting bracket 27. Whereby, when the motor 26 operates, the printing head holder 271 is brought to smoothly and stably slide on and along the linear guide rails 22.

Figure 4:
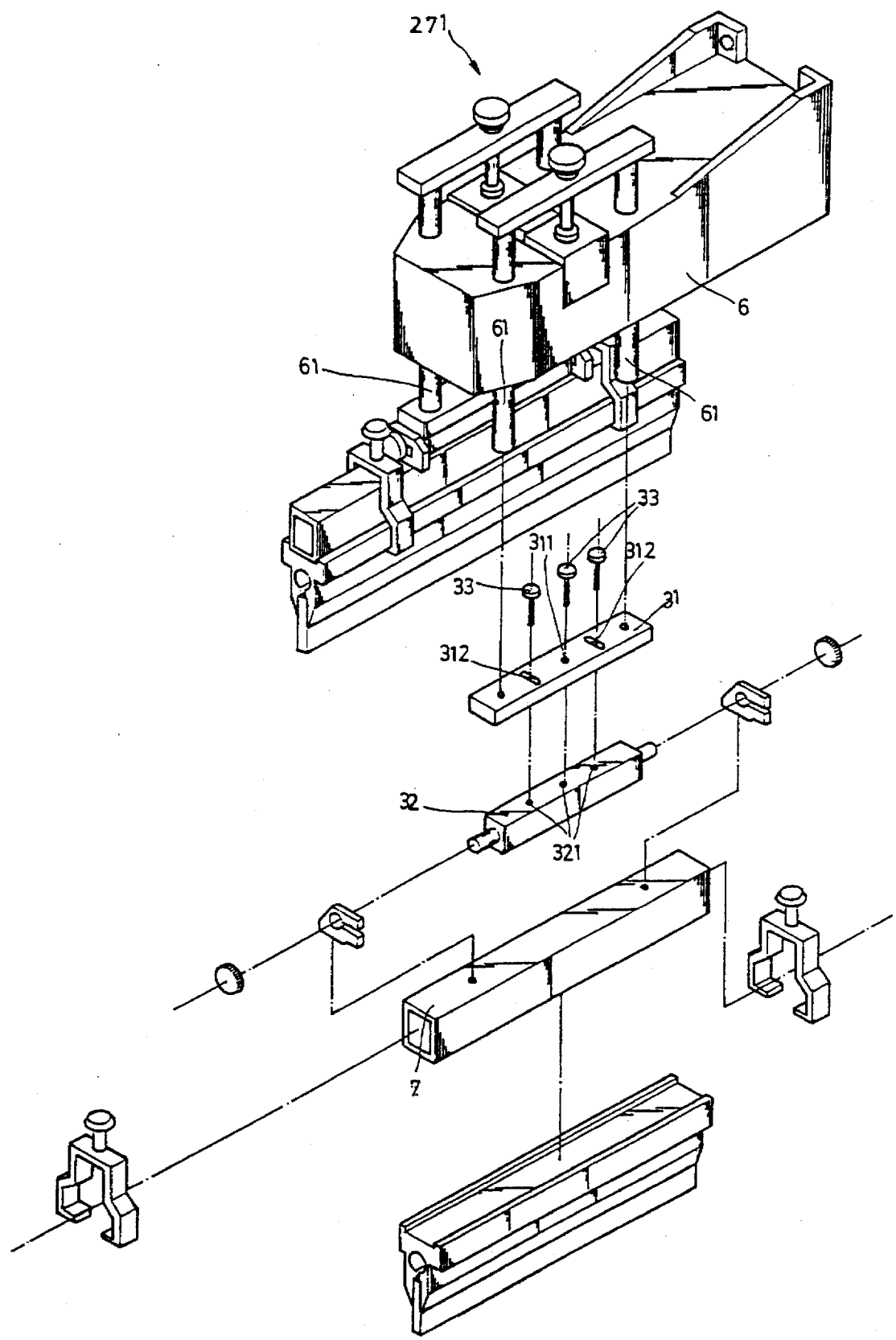
FIG. 4 is a disassembled perspective showing the exchangeable printing head and stencil cleaning lift-up mechanism of the present invention.

FIG. 4 illustrates the exchangeable printing head and stencil cleaning lift-up mechanism 3. Since the mechanism 3 includes two identical sets of exchangeable printing scraper arranged side by side, the following will describe only one set thereof. Each set of the exchangeable printing scraper mainly includes a locating plate 31, an adjustable plate 32, and a plurality of locating screws. The locating plate 31 is fixedly attached to a neck portion 6 of the printing head holder 271 by connecting to lower ends of two rods 61 downward projected from the neck portion 6. The locating plate 31 has a central locating hole 311 and two transversely extended long slots 312 separately located at two sides of the central hole 311. The adjustable plate 32 is mounted on a rail located below the neck portion 6. The adjustable plate 32 has threaded holes 321 formed thereon respectively corresponding to the central locating hole 311 and the long slots 312 on the locating plate 31. Locating screws 33 may be used to thread through the locating central hole 311 and long slots 312 and then the corresponding threaded holes 321 so as to adjustably connect the adjustable plate 32 to the locating plate 31.

Figure 5:
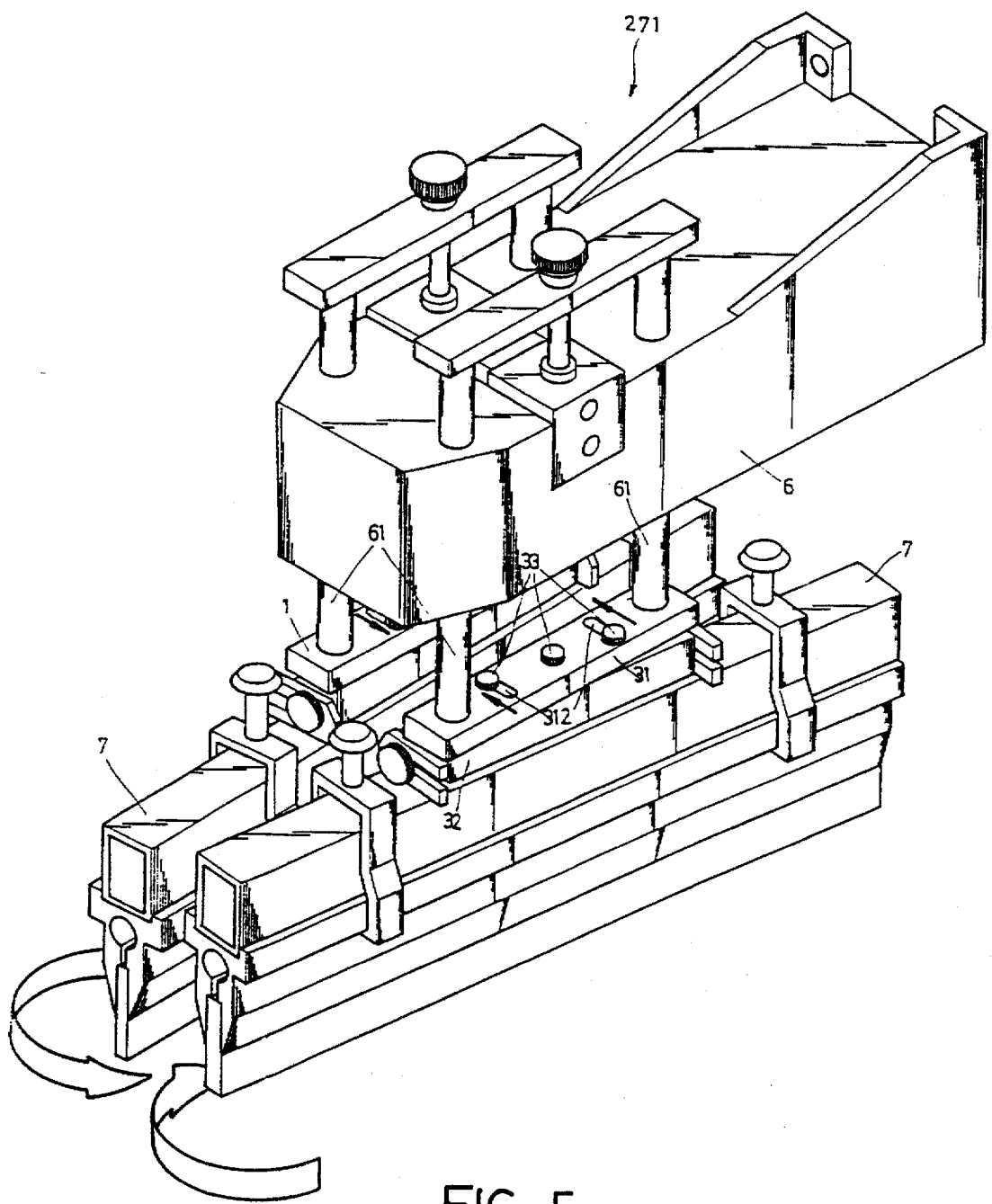
FIGS. 5 through 8 illustrate the exchangeable printing heads and stencil cleaning lift-up mechanism having different shapes and adjusted to different working angles.

Please refer to FIGS. 4 and 5 at the same time. To adjust the adjustable plate 32 relative to the locating plate 31, first loosen the locating screws 33 in the central locating hole 311 and the long slots 312 to such an extent that the adjustable plate 32 may be turned or shifted about the locating screws 33 threaded into the central hole 311. At this time, the adjustable plate 32 can be adjusted to a certain angle relative to the neck portion 6.

Figure 6B:
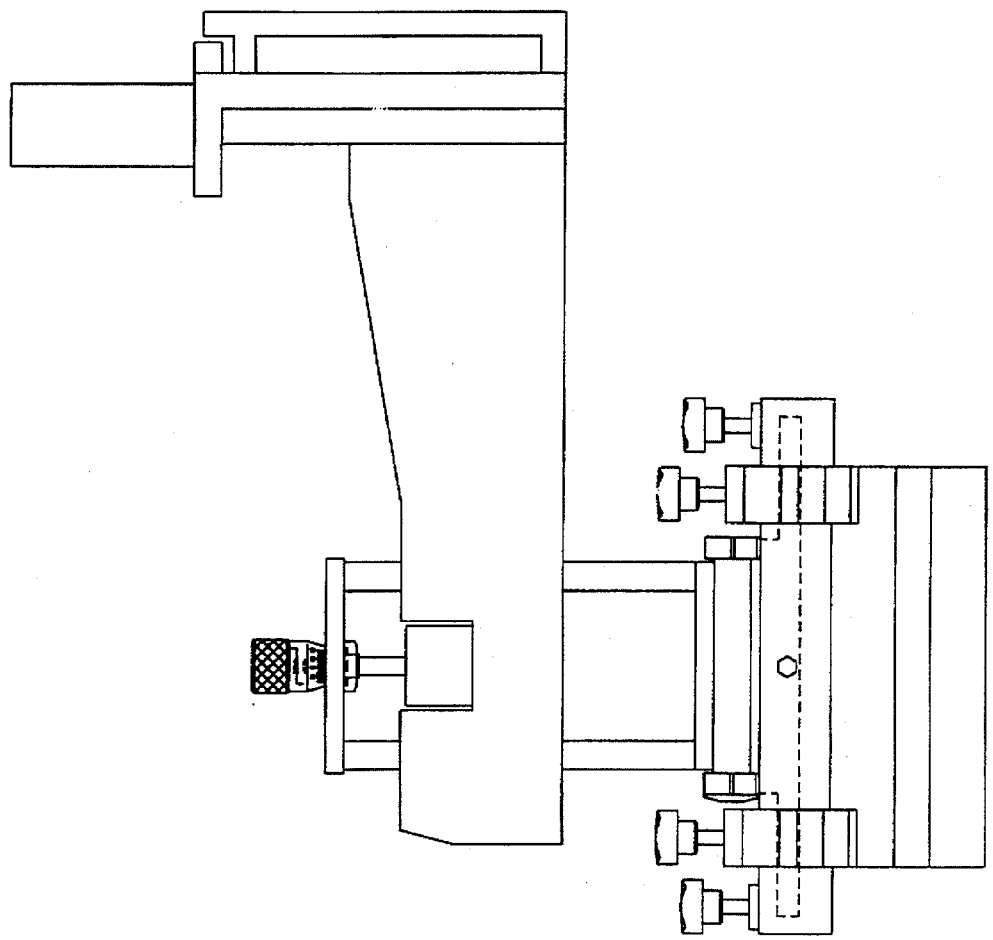
Figure 6A:
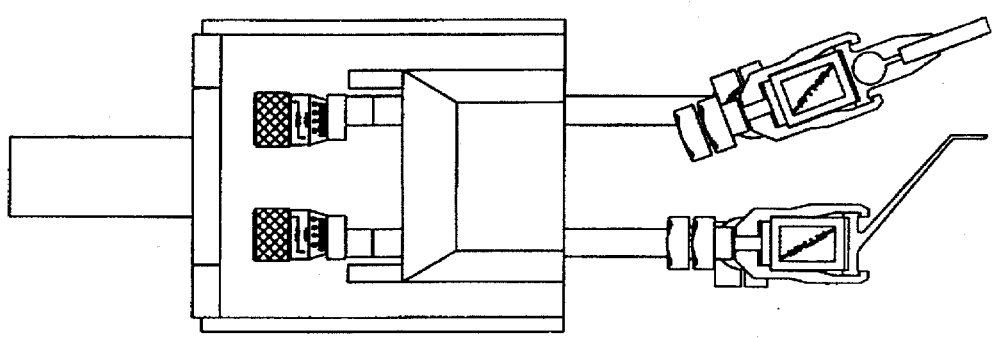

FIGS. 6A and 6B illustrates two printing heads in shapes and inclinations suitable for ordinary printing, such as the painting of normal green paint, the printing of circuits, and the printing of markings, etc.

Figure 7B:
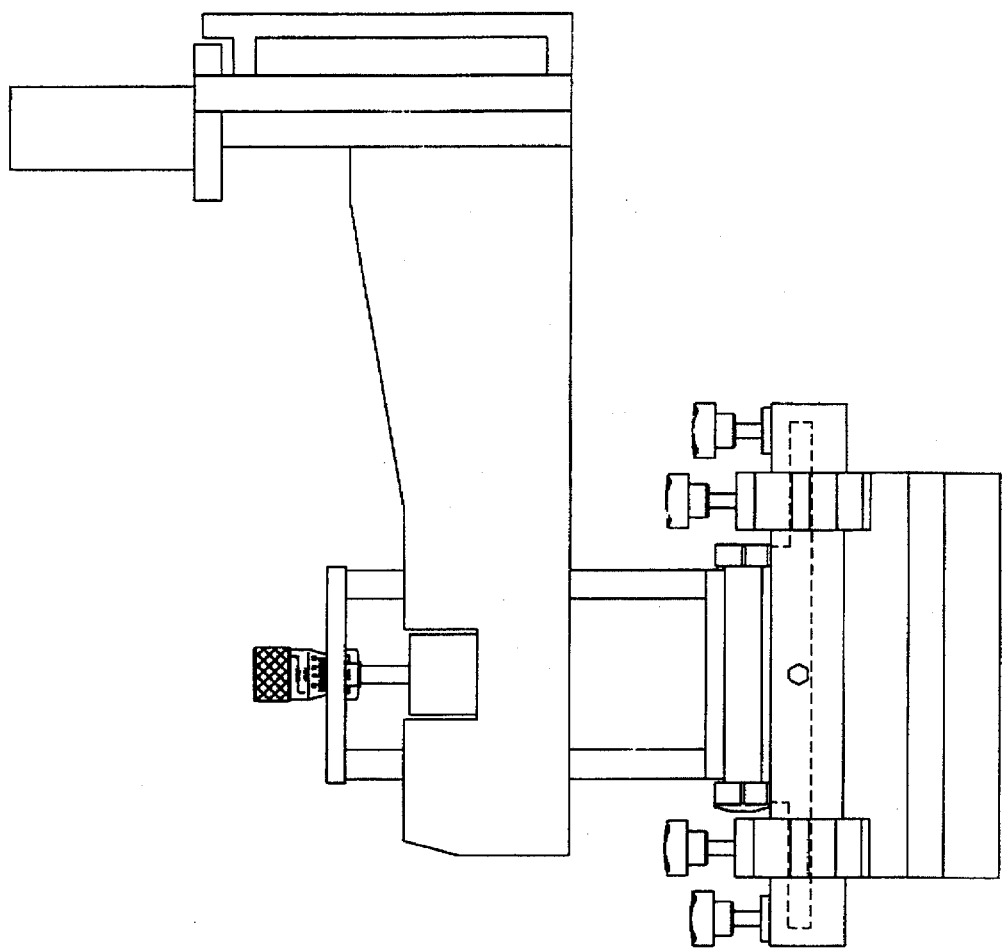
Figure 7A:
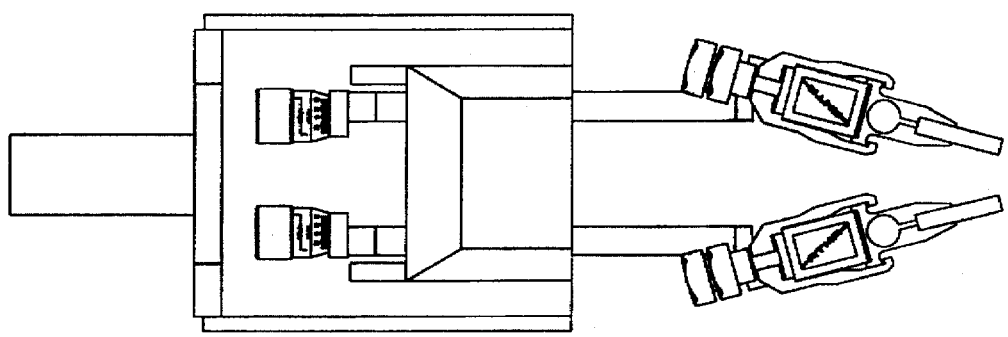

FIGS. 7A and 7B illustrates two printing scrapers in shapes and inclinations suitable for plug-hole printing (that is, use scrapers positioned in opposite directions to press ink into holes formed on the PC board).

Figure 8B:
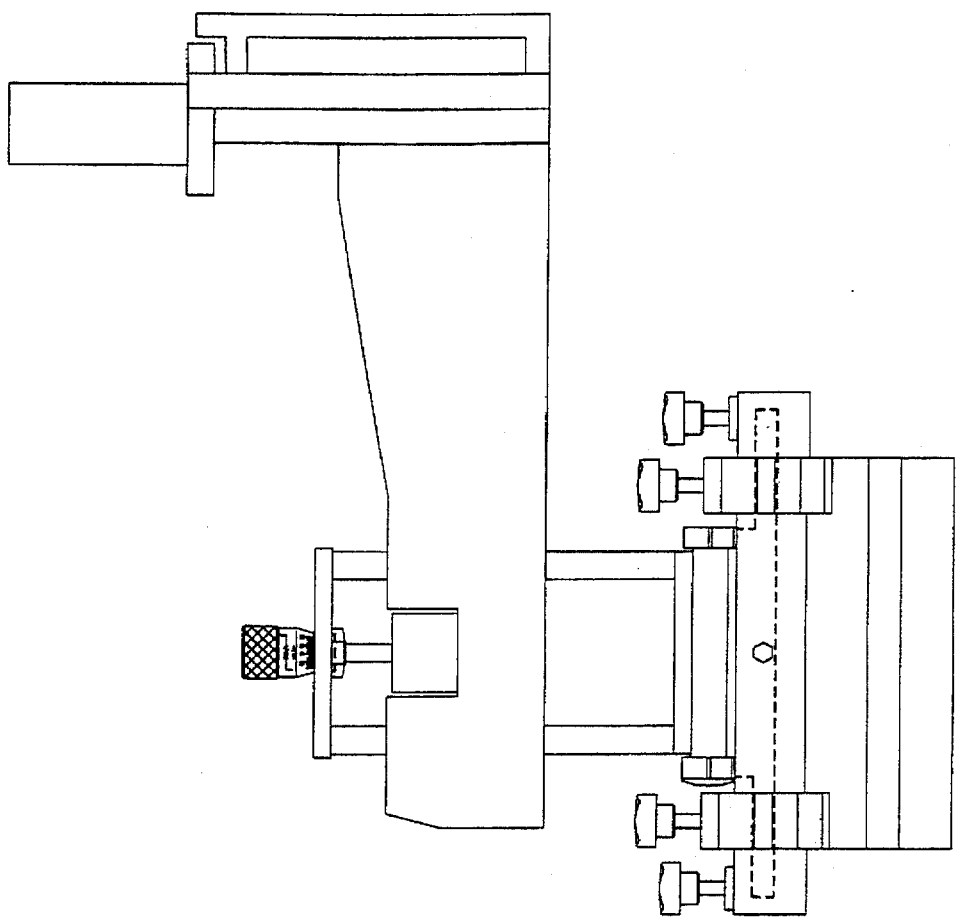
Figure 8A:
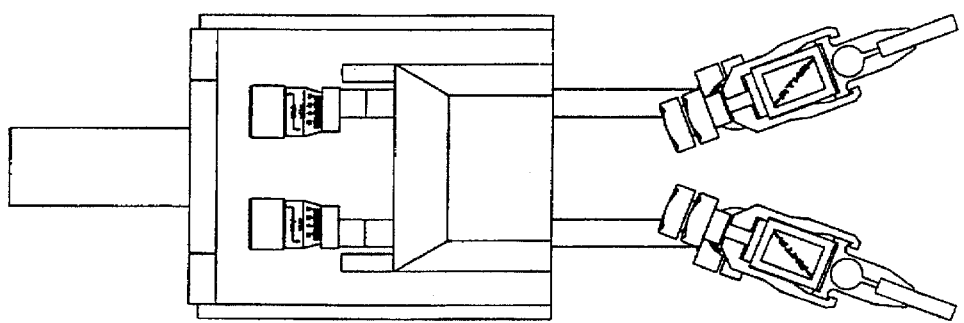

FIGS. 8A and 8B illustrates two printing heads in shapes and inclinations suitable for reciprocatingly printing in two axial directions. When cooperating with the two-side sentcil-lifting operation, any and all corners of the circuit Lines can be reached by the printing scrapers to reduce the possibility of biased printing.

FIG. 9 shows the simple stencil frame holder and dual-oil-cylinder stencil lifting mechanism 4 of the present invention. The mechanism 4 mainly includes a guide rail 41 having a channel 411 formed therein for two sliding keys 42 to slidably move in and along the channel 411, and two sets of cantilever arms 43. For the cantilever arms 43 to slidably move along the guide rail 41, each of them further has an oil cylinder 44, a pair of end rod bearings 45, a screw 46, a nut 47, a rod 48, a fine-adjustment bolt 49, two fine-adjustment dovetail members 8, and a stencil frame holder 9.

The channel 411 longitudinally extends through the guide rail 41 for the two sliding keys 42 and two sensor switches 412 to set therein. The sensor switches 412 are used to control a laterally shifting travel of the printing head on the guide rail 41, and since they are not a subject matter of the present invention, they are not discussed herein. The sliding key 42 each is slidably set in the channel 411 by means of a projected top and a projected bottom edges thereof. A threaded hole 421 is formed on a front surface of the sliding key 42 for a handle-attached screw 431 at a rear end of the cantilever arm 43 to tightly screw into.

There are three through holes 432, 433, and 434 provided on a top surface of the cantilever arm 43. The screw 46 can be threaded upward into the central through hole 432 to connect the oil cylinder 44 disposed on the arm 43 with the nut 47 screwed to a bottom end of the screw 46. The pair of end rod bearings 45 are inserted into the other two through holes 433,434. A sliding block 435 is connected to a rear end of each cantilever arm 43. A projected portion 4351 is formed at a top portion of the sliding block 435 and the handle-attached screw 431 threads through the projected portion 4351 and into the sliding key 42 via the threaded hole 421, such that the projected portion 4351 is allowed to slidably move along a front portion of the channel 411 while the sliding key 42 connected to the handle-attached screw 431 slides in a rear portion of the channel 411 at the same time to bring the cantilever arm 43 to move along the guide rail 41. The rod 48 each has a threaded hole 481 formed at a central portion to receive a lower end of the screw 482 and two connecting blocks 482 separately pivotally connected to two outer ends thereof. The connecting black 482 each has a front opening 483 to accommodate a lower portion of the end-rod bearing 45. The fine-adjustment dovetail member 8 each is pivotally connected to a rear end surface of the connecting block 482. Each find-adjustment dovetail member 8 further includes a dovetail groove 81 for a sliding cover 82 to engage into, and two top threaded holes 83 for a top cover 84 to fix thereto by screws. The sliding cover 82 is provided at a front surface with holes 821 for the stencil frame holder 9 to connect thereto.

Loosening of the screwing tightness of the handle-attached screws 431 to their connected sliding keys 42 against the guide rail 41 allows the cantilever arms 43 with the two stencil frame holders 9 to be shifted along the guide rail 41 to match any size of printing stencil. And, with the oil cylinders 44, the printing stencil held by the cantilever arms 43 can be lifted at either side during printing to achieve better print effect. The fine-adjustment dovetail members 8 and their sliding covers 82 permit an aluminium frame of the printing stencil to be precisely adjusted to a required equal level at each corner thereof.

Now, please refer to FIG. 10 which illustrates the automatically bi-dirctionally movable printing stable mechanism 5 of the present invention. The mechanism 5 mainly includes a printing table 10, a pivotal connecting board 53 disposed between an underside of the printing table 10 and a top platform 52 of the printing machine, and a sideward translation mechanism 54 and a longitudinal translation mechanism 55 connected to the pivotal connecting board 53.

The pivotal connecting board 53 has a shape and an area corresponding to those of the printing table 10 and is movably connected to the underside of the printing table 10 by the sideward translation mechanism 54 and to the top surface of the top platform 52 by the longitudinal translation mechanism 55. The pivotal connecting board 53 is formed at its edges with several cuts 531 against each of which a supporting block 532 is fixed for some parts of the sideward translation mechanism 54 to attached thereto.

The sideward translation mechanism 54 mainly includes several sets of sideward translation means 541, two fine-adjustment knobs 542 for sideward translation, and an air cylinder 543 for sideward translation. The sideward translation means 541 each consists of a male and female rail members slidably engaged with each other. The sideward translation means 541 are positioned between the printing table 10 and the pivotal connecting board 53 with the male rail members fixedly attached to a top surface of the pivotal connecting board 53 and the female rail members to the underside of the printing table 10 , so that the printing table 10 is permitted to slidably move rightward or leftward relative to the pivotal connecting board 53. The fine-adjustment knobs 542 for sideward translation are separately provided on two of the supporting blocks 532 attached to two opposite cuts 531 of the pivotal connecting board 53. When the knobs 542 are screwed inward or outward to press against or disengage from two stop plates 511 downward projected from the underside of the printing table 10 into the cuts 531, so as to set or adjust the space allowed for the sideward translation of the printing table 10. The air cylinder 543 for sideward translation is connected to one of the supporting blocks 532 other than the two with fine-adjustment knobs. The air cylinder 543 has a shaft which extends through a hole on the supporting block 532 and is fixedly connected via a pull rod to an actuating block 512 downward projected from the underside of the printing table 10 into the corresponding cut 531 of the pivotal connecting board 53, so that the air cylinder 543 may push or pull the actuating block 512 to cause the printing table 10 to reciprocatingly move laterally.

The longitudinal translation mechanism 55 mainly includes several sets of longitudinal translation means 551, two fine-adjustment knobs 552 for longitudinal translation, and an air cylinder 553 for longitudinal translation. The longitudinal translation means 551 is similar to the sideward translation means 541 but are positioned in a longitudinal direction between the pivotal connecting board 53 and the top platform 52 with the male rail members fixedly attached to a top surface of the top platform 52 and the female rail members to an underside of the pivotal connecting board 53, so that the pivotal connecting board 53 is permitted to slidably move forward or backward relative to the top platform 52. At this point, since the printing table 10 is fixedly positioned over the pivotal connecting board 53, it is moved forward or backward along with the pivotal connecting board 53.

The fine-adjustment knobs 552 for longitudinal translation are separately provided on two supporting stripes 521 separately attached to a front and a rear edges of the working table top 52. When the knobs 552 are screwed inward or outward to press against or disengage from a front and/or a rear edge of the pivotal connecting board 53, so as to set or adjust the space allowed for the longitudinal translation of the pivotal connecting board 53. The air cylinder 553 for longitudinal translation has a shaft which extends through a hole on the of the supporting stripes 521 to directly fix to the rear edge of the pivotal connecting board 53 at a proper point via a pull rod, so that the air cylinder 553 may push or pull the pivotal connecting board 53 via the pull rod to cause the pivotal connecting board 53 to move over the several sets of longitudinal translation means 551 in a longitudinal direction relative to the top platform 52. The printing table 10 moves, accordingly, along with the pivotal connecting board 53 longitudinally.

Figure 11:
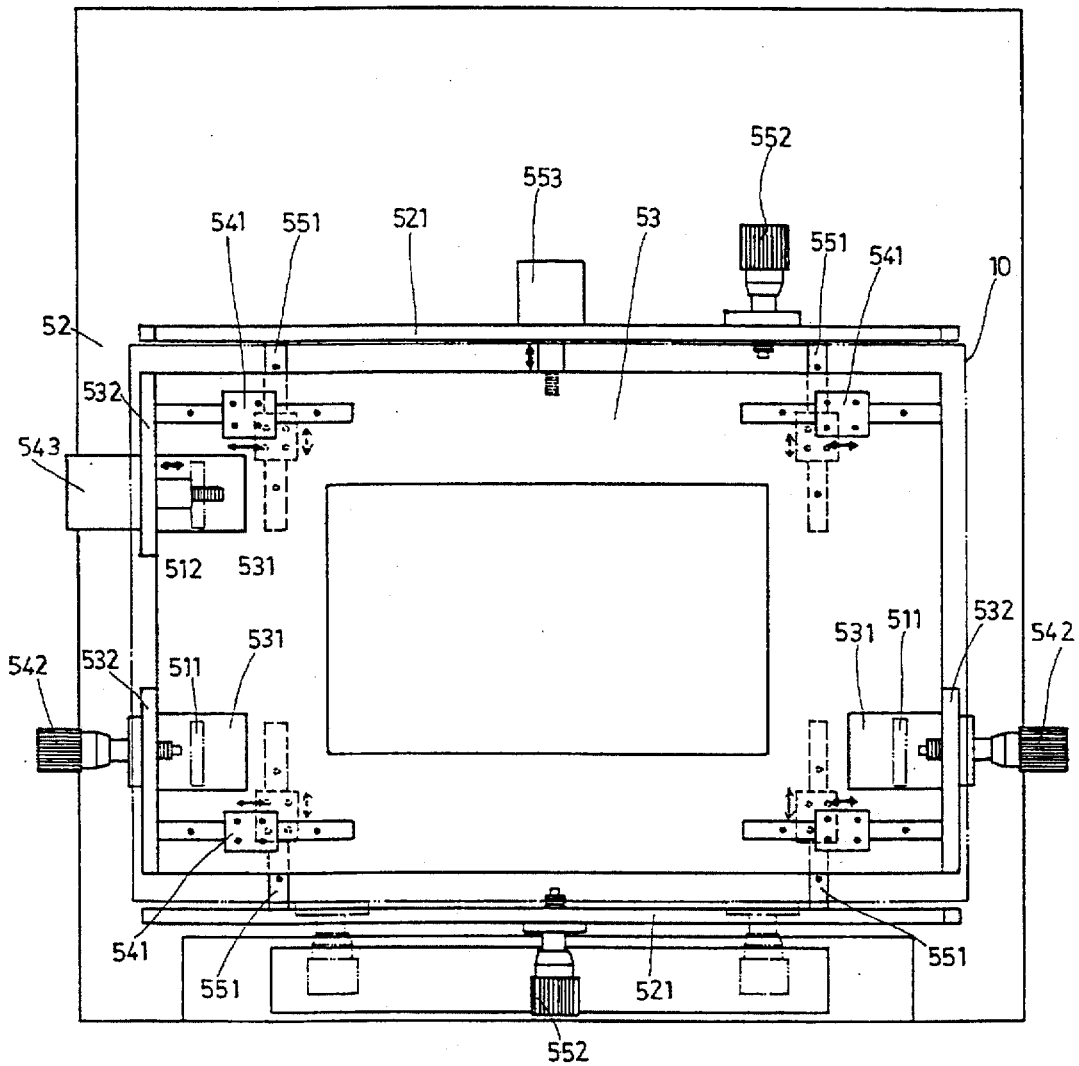
FIG. 11 is a top plan view of the automatically bi-directionally movable printing table mechanism of FIG. 10.

FIG. 11 is a plan top view showing the layout of the whole structure of the automatically bi-directionally movable printing table mechanism 5.

Figure 12:
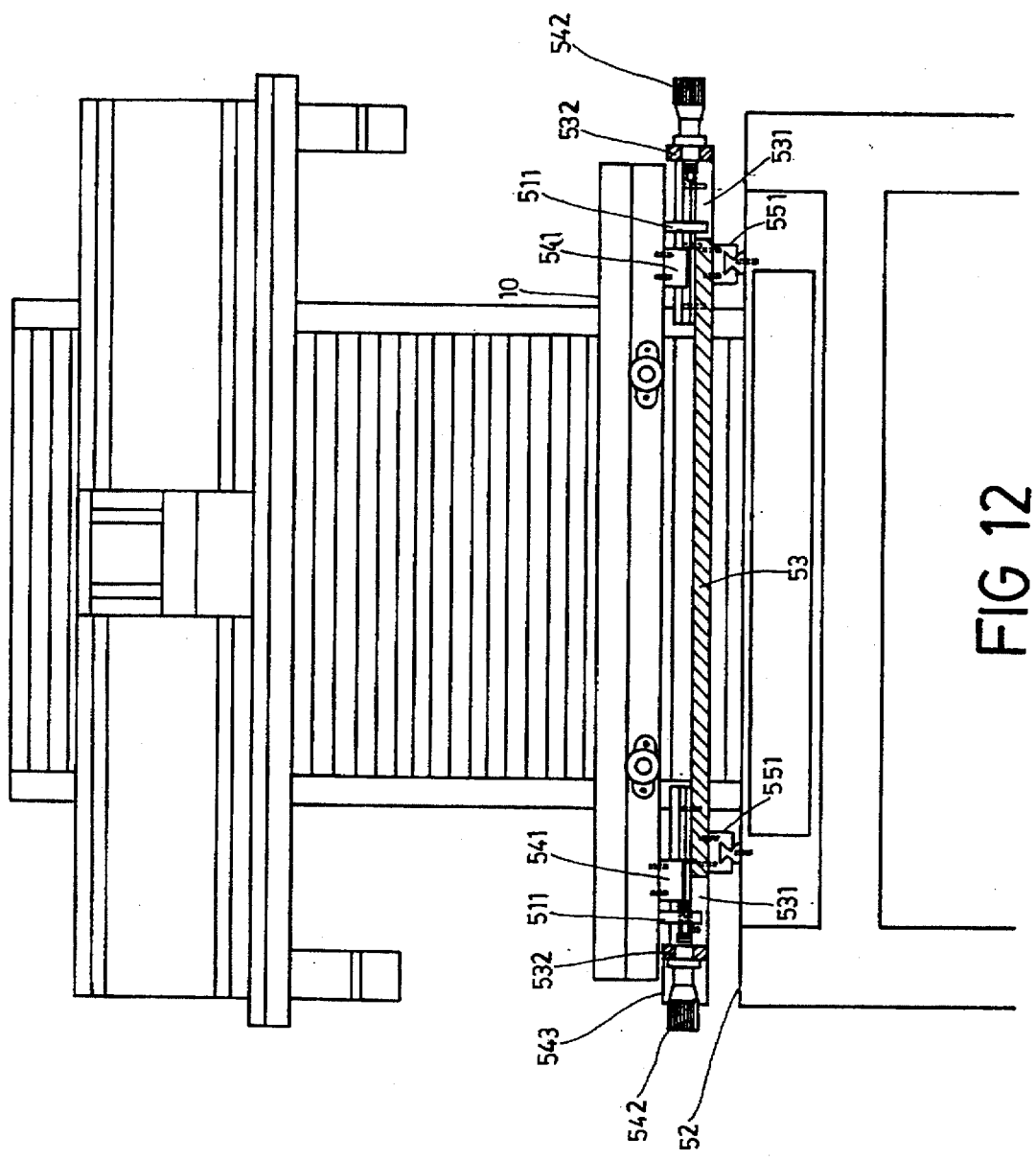
FIG. 12 is a front and partial sectional view of the automatically bi-directionally movable printing table mechanism.
Figure 13:
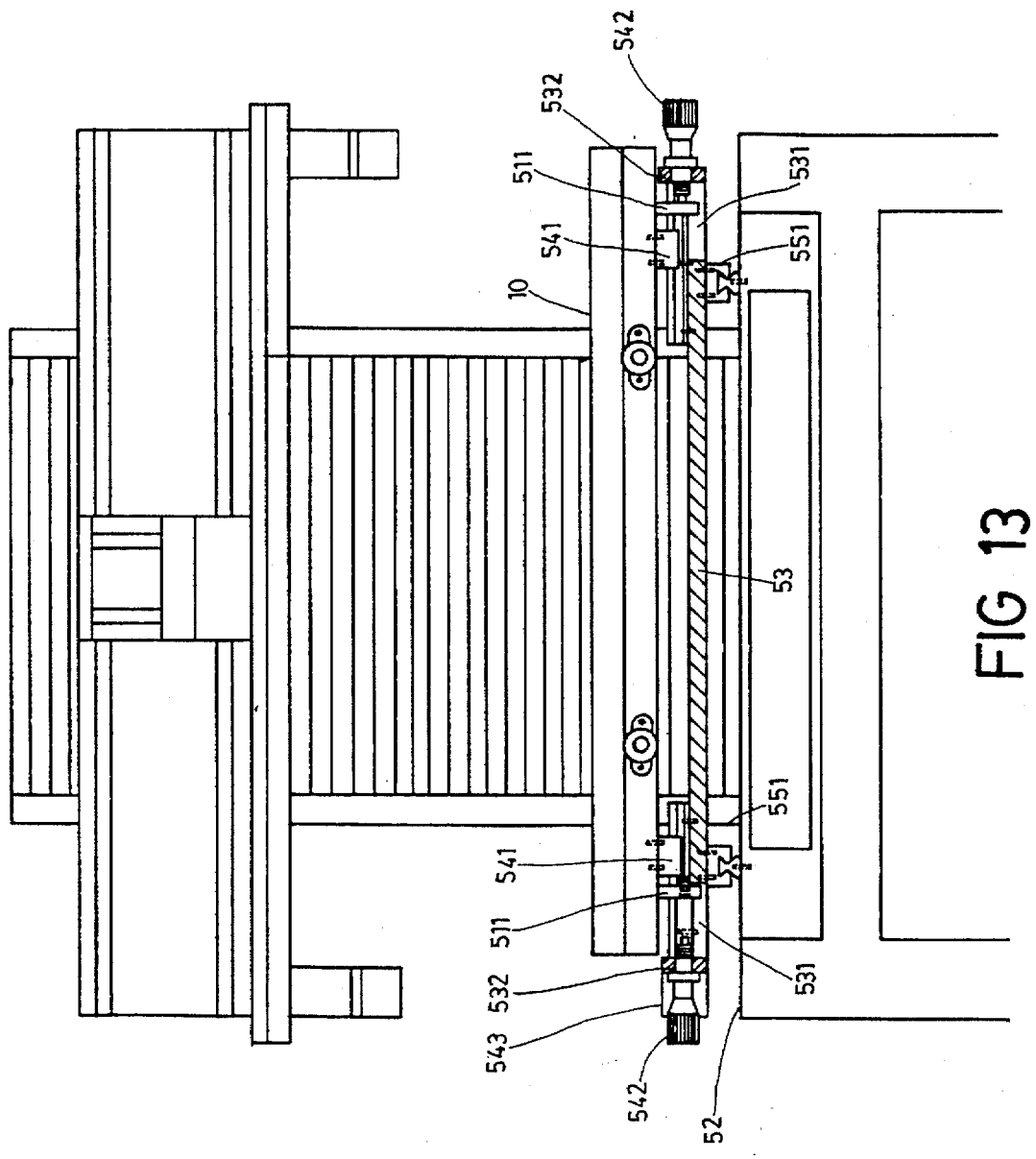
FIG. 13 illustrates the manner in which the bi-directionally movable printing table mechanism moves sideward.

FIGS. 12 and 13 illustrate the printing table 10 is moved sideward relative to the top platform 52 and the pivotal connecting board 53. As shown in the figures, the two fine-adjustment knobs 542 of the sideward translation mechanism 54 are adjusted to set the space allowed for sideyard translation of the printing table 10 (this adjustment is made before the printing table 10 starts working), and then, the air cylinder 543 is actuated to push or pull the actuating block 512 so that the printing table 10 is carried by the several sets of sideward translation means 541 to move leftward or rightward.

Figure 14:
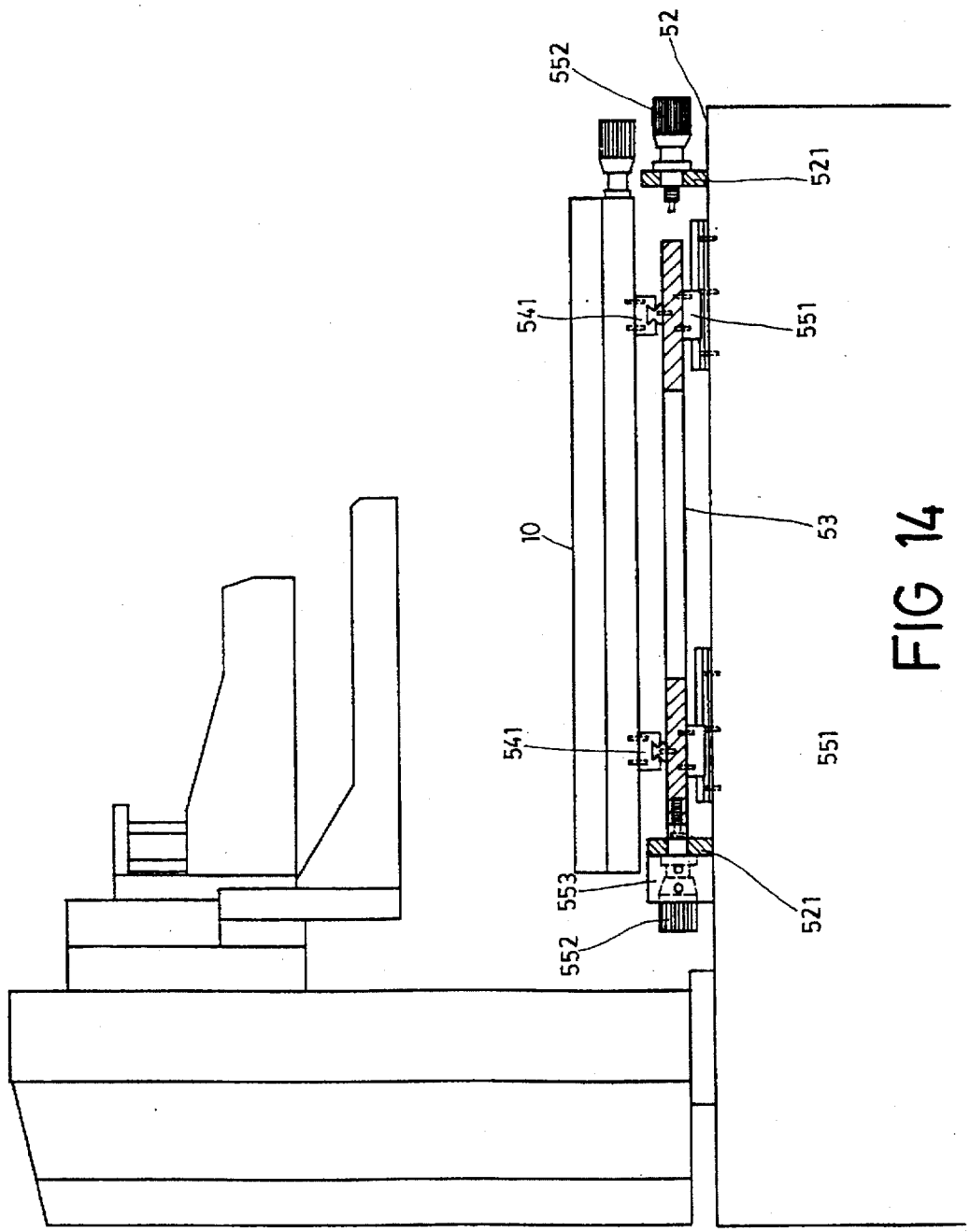
FIG. 14 is a side and partial sectional view of the automatically bi-directionally movable printing table mechanism.
Figure 15:
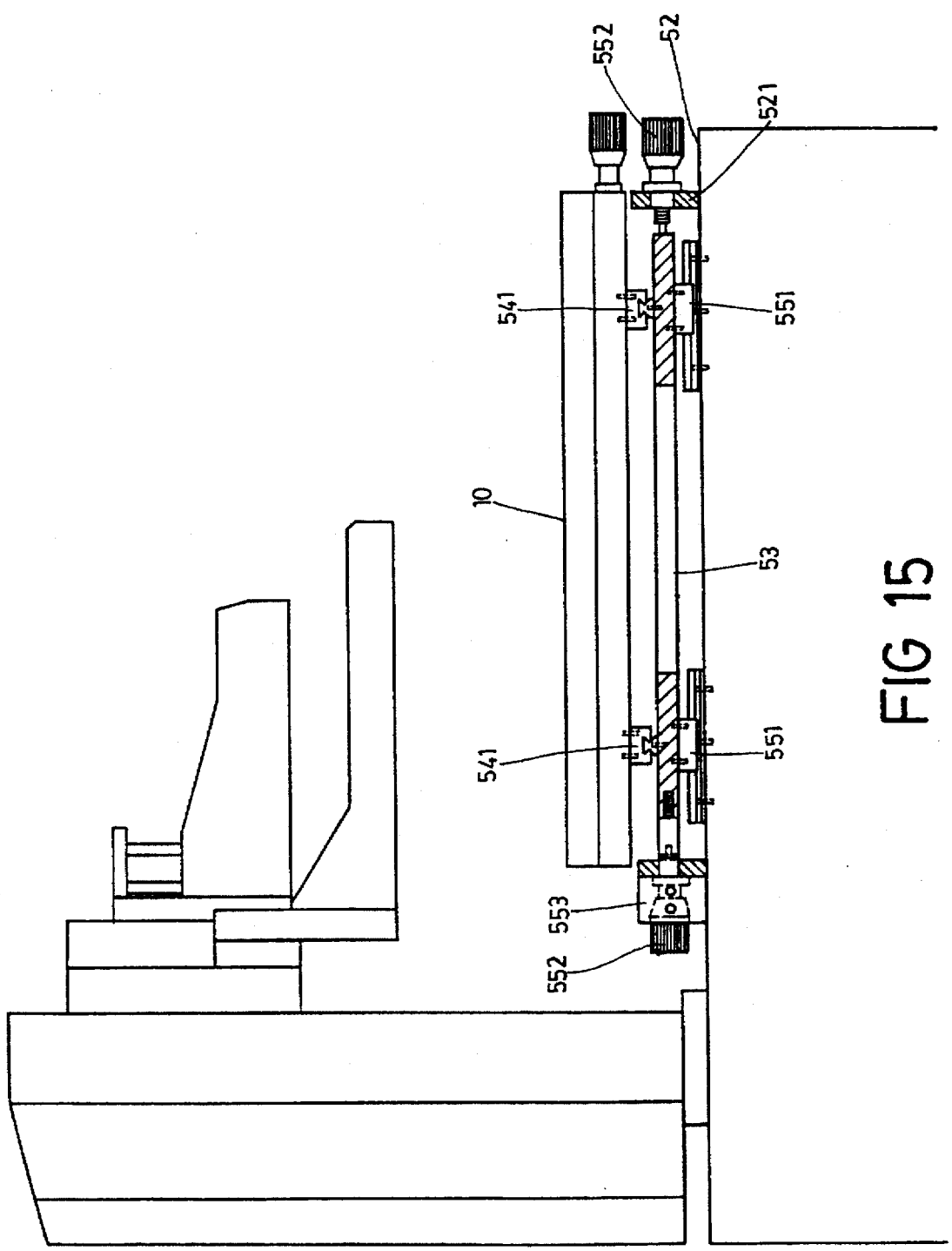
FIG. 15 illustrates the manner in which the bi-directionally movable printing table mechanism moves longitudinally.

FIGS. 14 and 15 illustrate the printing table 10 is moved longitudinally relative to the top platform 52. As shown in the figures, the two fine-adjustment knobs 552 of the longitudinal translation mechanism 55 are adjusted to set the space allowed for longitudinal translation of the printing table 10 ( this adjustment is made before the printing table 10 starts working), and then, the air cylinder 553 is actuated to push or pull the pivotal connecting board 53 so that the pivotal connecting board 53 and the printing table 10 over it are together carried by the several sets of longitudinal translation means 551 to move forward or backward relative to the top platform 52.

The above-described translation of the printing table 10 in sideward or longitudinal directions is not necessarily performed in any fixed order, that is, the printing table 10 can be first translated sideward and then longitudinally, first longitudinally and then sideward, or moved in two directions at the same time. All of such translations can be performed through the operation of the air cylinders 543 and 553 under the control of a micro-computer program.

What is claimed is:

1. A PC board printing machine with a cantilever-supported printing head holder and stencil holder and a bi-directionally movable printing table, comprising; a movable cantilever support mechanism for vertically moving the printing head holder and the printing stencil holder; a motor operated dual-rail transmission mechanism fixed to said cantilever mechanism for moving said printing head holder laterally and reciprocatingly; an exchangeable printing head and stencil cleaning lift-up mechanism connected to said printing head holder and having printing scrapers adjustable in shape and position to enable printing in different manners; a stencil frame holder and dual-oil-cylinder stencil lifting mechanism having two cantilever arms attached to a lower portion of said cantilever support mechanism and said motor operated dual-rail transmission mechanism for adjustably holding a printing stencil between said two cantilever arms; and a bi-directionally movable printing table mechanism disposed on a top platform below said printing head holder and said two cantilever arms to support an object to be printed and to move laterally and longitudinally relative to said top platform.

2. The PC board printing machine as claimed in claim 1, wherein said movable cantilever support mechanism comprises: a cantilever member; a threaded stem with a hand wheel connected to said cantilever member; an air cylinder connected to said cantilever member; and two fixing shafts extending through end portions of said cantilever member so that said cantilever member may move up and down along said fixing shafts, said threaded stem with hand wheel extending through a top center of said cantilever member and being attached thereto for adjusting the height of the cantilever member, said air cylinder being connected to a lower side of said cantilever member for driving said cantilever member to move up or down along said fixing shafts.

3. The PC board printing machine as claimed in claim 1, wherein said motor operated dual-rail transmission mechanism comprises a back board fixedly mounted onto a protective housing, two linear guide rails, a plurality of guide rail blocks, two locating clamp mates, a transmission belt, a motor, and a printing head connecting bracket; two guide rail support supporters mounted on a front surface of said back board with said two linear guide rails attached thereto, said guide rail blocks mounted on said two linear guide rails and said printing head connecting bracket fixedly secured to said guide rail blocks, said motor being connected adjacent to end of said back board with a rotary shaft extending through said back board; a gear mounted on said rotary shaft to drive said transmission belt said locating clamp mates fixedly fastened on said transmission belt; said printing head connecting bracket and one of said guide rail blocks fixedly secured to a lower and an upper portion of said locating clamp mates, respectively; said printing head holder being connected to said printing head connecting bracket, whereby, when said motor operate, said printing head holder slides on and along said linear guide rails.

4. The PC board printing machine as claimed in claim 1, wherein said exchangeable printing head and stencil cleaning lift-up mechanism comprises; two identical sets of exchangeable printing scrapers arranged side by side and attached to a lower side of said printing head holder, each set of said changeable printing scrapers including a locating plate, an adjustable plate, and a plurality of locating screws; said locating plate being fixedly attached to said printing head holder by two rods extending downwardly from said printing head holder, said locating plate having a central locating hole and two transversely extending elongated slots located on two sides of said central hole, said adjustable plate having a plurality of threaded holes formed thereon respectively located corresponding to said central locating hole and said elongated slots on said locating plate, and said locating screws threaded through said locating central hole and said elongated slots and then into said corresponding threaded holes so as to adjustably connect said adjustable plate to said locating plate.

5. The PC board printing machine as claimed in claim 1, wherein said stencil frame holder and dual-oil-cylinder plate lifting mechanism comprises; a guide rail on the cantilever support mechanism and having a channel formed therein: two sliding keys and two printing head inducing switches slidably located in said channel; a cantilever arm attached to each of said two sliding keys, each of said cantilever arms having an oil cylinder, a pair of end rod bearings, a screw, a nut, a rod, a fine-adjustment bolt, two fine-adjustment dovetail members with sliding covers, and a stencil frame holder connected thereto; said sliding keys each being slidably set in said channel by means of projected top and projected bottom edges thereof and each having a threaded hole formed on a front surface thereof: a screw having a handle attached extending through each cantilever arm and engaging each of said threads holes, said cantilever arm each being provided with three through holes, said screw being threaded into a middle one of said through holes to connect said oil cylinder disposed on said cantilever arm with said nut screwed to a bottom end of said screw, said pair of end rod bearings being inserted into the other two of said through holes on said cantilever arm, a sliding block connected to a rear end of each of said cantilever arms and having an upper projected portion through which said screw having a handle attached is threaded into one of said sliding keys, such that said cantilever arm is carried by said sliding key to move along said guide rail; said rod each having a threaded hole formed at a central portion to receive a lower end of said screw and two connecting blocks separately pivotally connected to two outer ends thereof, said connecting blocks each having a front opening to accommodate a lower portion of said end-rod bearing; said fine-adjustment dovetail members each pivotally connected to a rear end surface of said connecting block and each further including a dovetail groove engaging a sliding cover of one of said dovetail members, and two top threaded holes mounting a top cover, said sliding cover provided with a front surface connected to said stencil frame holder; whereby loosening of said screws having a handle attached from their connected sliding keys allows said cantilever arms with said two stencil frame holders to be laterally shifted along said guide rail to match any size of printing stencil, and, with said oil cylinders, said printing stencil held by said cantilever arms can be lifted at either side during printing, moreover, said fine-adjustment dovetail members and their sliding covers permit a frame of said printing stencil to be precisely adjusted.

6. The PC board printing machine as claimed in claim 1, wherein said bi-directionally movable printing table mechanism comprises: a printing table, a pivotal connecting board disposed between an underside of said printing table and a top platform of said printing machine, a lateral translation mechanism and a longitudinal translation mechanism connected to said pivotal connecting board;

said pivotal connecting board having a shape and an area corresponding to said printing table and movably connected to the underside of said printing table by said lateral translation mechanism and to a top surface of said top platform by said longitudinal translation mechanism, said pivotal connecting board formed at its edges with several cuts, against each of which a supporting block is fixed for attachment of said lateral translation mechanism;

said lateral translation mechanism comprising a plurality of sets of lateral translation means, two fine-adjustment knobs for lateral translation, and a first air cylinder for lateral translation;

said lateral translation means each comprising lateral male and female rail members slidably engaged with each other and positioned between said printing table and said pivotal connecting board with said lateral male rail members fixedly attached to a top surface of said pivotal connecting board and said lateral female rail members fixedly attached to an underside of said printing table so that said printing table is permitted to slidably move laterally relative to said pivotal connecting board;

one of said fine-adjustment knobs for lateral translation provided on each of two of said supporting blocks attached to two cuts in said pivotal connecting board for screwing inward or outward to press against or disengage from two stop plates downwardly projecting from the underside of said printing table into said cuts so as to adjust the space allowed for a lateral translation of said printing table;

said first air cylinder for lateral translation connected to one of said supporting blocks other than those with fine-adjustment knobs, and having a shaft extending through a hole in said supporting block and fixedly connected via a pull rod to an actuating block downwardly projecting from the underside of said printing table into corresponding cut of said pivotal connecting board, so that said air cylinder may push or pull said actuating block to cause said printing table to reciprocatingly move laterally;

said longitudinal translation mechanism comprising a plurality of sets of longitudinal translation means, two frame-adjustment knobs for longitudinal translation, and a second air cylinder for longitudinal translation;

said longitudinal translation means being positioned in a longitudinal direction between said pivotal connecting board and said top platform including longitudinal male rail members fixedly attached to a top surface of said top platform and longitudinal female rail members fixedly attached to an underside of said pivotal connecting board, and slidably engaging the longitudinal male rail members so that said pivotal connecting board is permitted to slidably move longitudinally relative to said top platform while said printing table fixedly positioned over said pivotal connecting board is moved longitudinally along with said pivotal connecting board;

one of said fine-adjustment knobs for longitudinal translation provided on each of two supporting stripes attached to front and rear edges of said top platform for screwing inward or outward to press against or disengage from front and rear edges of said pivotal connecting board so as to adjust the space allowed for a longitudinal translation of said pivotal connecting board; and said second air cylinder for longitudinal translation having a shaft extending through a hole on one of said supporting stripes and affixed to the rear edge of said pivotal connecting board via a pull rod, so that said second air cylinder may push or pull said pivotal connecting board via said pull rod to cause said pivotal connecting board to move in a longitudinal direction relative to said top platform.

* * * * *